Dec. 30, 1930. L. L. JONES Re. 17,915
RADIO FREQUENCY AMPLIFYING SYSTEM
Original Filed Aug. 21, 1925
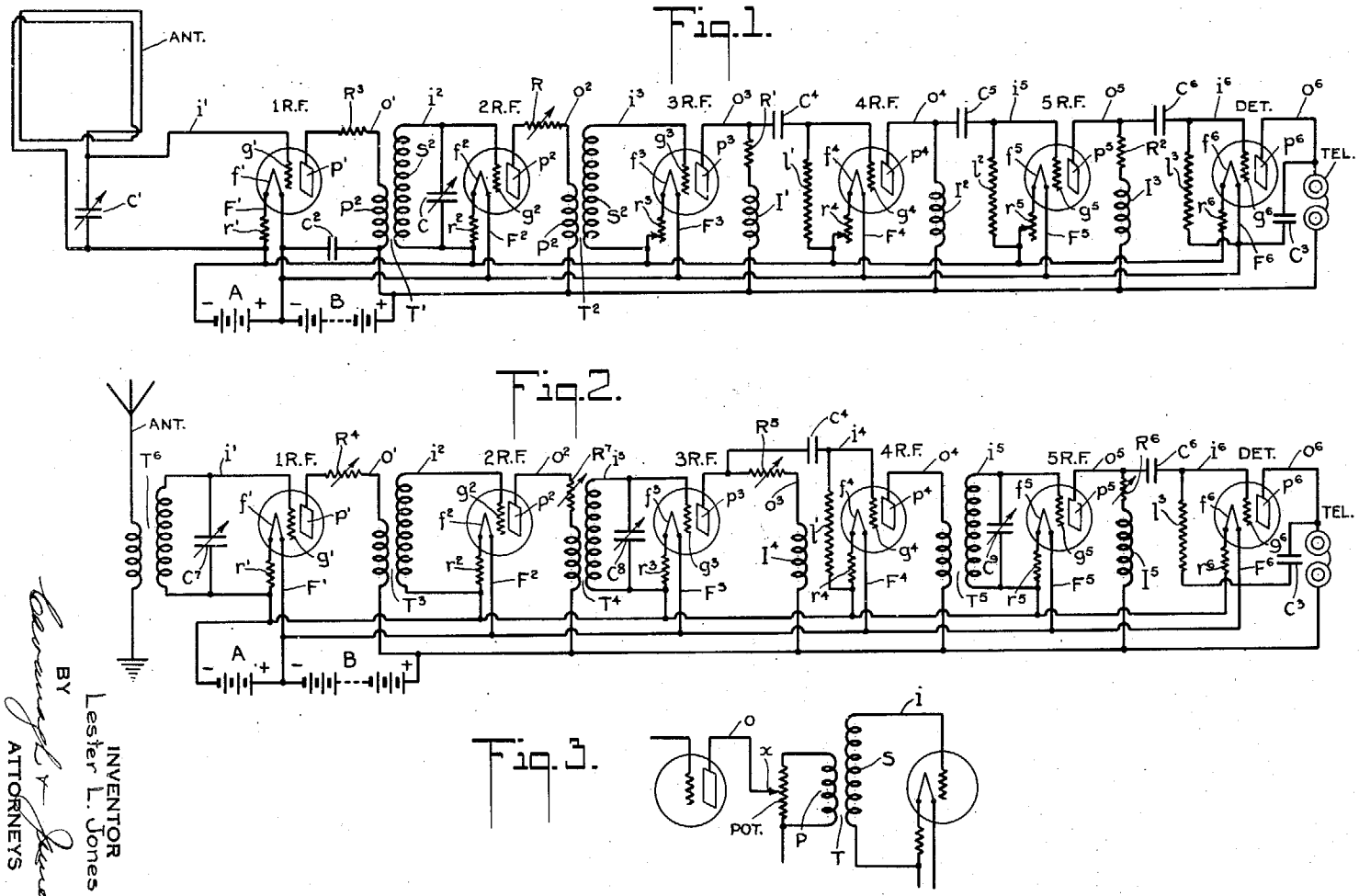
INVENTOR
Lester L. Jones
BY
Cavanagh & Jones
ATTORNEYS Reissued Dec. 30, 1930

Re. 17,915

UNITED STATES PATENT OFFICE

LESTER L. JONES, OF ORADELL, NEW JERSEY

RADIO FREQUENCY AMPLIFYING SYSTEM

Original No. 1,713,132, dated May 14, 1929, Serial No. 51,569, filed August 21, 1925. Application for reissue filed October 4, 1929. Serial No. 397,426.

This invention relates to audion or electron discharge tube amplifier circuits, and relates more particularly to an improved radio frequency audion amplifier system.

The prime desideratum of my present invention centers about the provision of a radio frequency audion amplifying system in which the number of cascaded radio frequency stages or electron discharge tubes may be increased beyond that hitherto found possible or practical, the improved system of my invention being characterized by an amplification power substantially greater than that obtainable in radio frequency systems known to the prior art.

A further and correlated prime object of the invention comprises the production of an increased power audion amplifying system which is highly stable, which possesses the characteristics of ease of tuning and high degree of selectivity, with the use of a minimum number of control elements, and which is designed so as to permit facile control of the output volume without altering the tuning or affecting the stability of the system.

As is well known, radio or wireless receiving systems embodying radio frequency amplification commonly include two and sometimes three electron discharge devices or tubes which are employed as amplifiers of the radio frequencies, these tubes being interlinked or coupled by circuits which are tunable to a selected frequency. In the most prevalent type of radio frequency system, all of the radio frequency coupled circuits are made tunable so as to be adjustable to the frequency which is to be transmitted through the system; and such systems are commonly known as tuned radio frequency systems.

It is now well recognized in the radio art that these tuned radio frequency systems are handicapped by serious limitations, prime among which is the inability or impracticability of utilizing more than two radio frequency tubes in cascade without creating reactions between the radio frequency circuits which vitally interfere with the stability and amplifying ability of the system. These reactions are largely the result of feedback forces which produce a feedback of energy taking place through various channels, such as the coupling between the output and input circuits of a tube, which may for convenience be referred to as adjacent stage feed-back coupling, and the coupling between an input or/and output circuit of one tube across to the input circuit of a preceding tube, which may for convenience of description be referred to as a distant stage feed-back coupling.

These feed-back reactions existing in tuned radio frequency systems are, as known, highly detrimental to the functioning of the radio frequency circuits in interfering with and impairing the relay amplifying power of the tubes, and in producing an instability of the circuits as well as a difficulty of tuning the same; and to obviate these defects, means have had to be devised for compensating for or neutralizing these feed-back reactions. It has been experimentally determined, however, that although the aforesaid adjacent stage feed-back reactions can be effectively compensated for by means devised for the purpose, the distant stage feed-back reactions incident to multi-stage radio frequency sets cannot be controlled, so that it has been found impossible and impractical to build radio frequency systems with more than two efficient radio frequency tubes or to obtain additional amplification by a third radio frequency tube.

I have discovered that these limitations inherent in tuned radio frequency systems may be avoided by the cascading of untuned radio frequency stages onto tuned radio frequency stages, and that the reactions between the stages may be so controlled as to permit the cascading of a large number of radio frequency tubes to produce a stable radio frequency system having an amplifying power substantially larger than, and as much as from 10 to 20 times greater than that found in tuned radio frequency systems hitherto known.

It has heretofore been suggested to cascade an untuned radio frequency stage onto a preceding tuned radio frequency stage, but systems embodying such cascaded stages have been found too inefficient for service, the prime reason being that the reactions introduced between the untuned output and a tuned input circuit were such that during the change of tuning of the input circuit and the system, the characteristic of the system would vary from that of too overdamped an input circuit to that of excessive oscillations, the overdamping of the input circuit during the tuning process being so great as to prevent the possibility of amplification, the change from overdamping to excessive oscillations, moreover, preventing the employment of a controllable feed-back neutralizing system. As far as I am aware, the underlying reason for this change of characteristic of the system during the tuning process and the remedy for it has not been known.

I have empirically determined the character of the reaction taking place between the untuned output and the tuned input circuits of the transition tube, and have found that these reactions may be so predetermined or controlled as to inhibit the transition from excessive oscillations of the input circuit to the overdamping of the input circuit, and with the elimination of the transition point, I am enabled to suitably neutralize the reactions so as to produce efficient amplification, and so as to permit the cascading of a large number of radio frequency stages for the production of a high power amplifying set.

The principal objects of my present invention may therefore be said to include the provision of a high power radio frequency system; the more specific provision of a radio frequency system in which an untuned radio frequency stage or stages is or are cascaded onto a tuned radio frequency stage, with the reactions between the same controlled to eliminate the de-stabilizing transition between the overdamping of the tuned stage and the production of excessive oscillations therein; the still further provision of a radio frequency system of this character in which the reactions between the untuned stage and the tuned stage are stabilized for the whole wave length range for which the system is designed; the still further provision of means for efficiently neutralizing these stabilized reactions whereby a system is produced having the characteristics of an amplifying power substantially greater than that heretofore known for radio frequency systems, and which system is further characterized by the pronounced stability of the circuits over the whole wave length range, the ease of tuning the same, the high selectivity obtainable with a small number of tuning controls, and the ability to control the output volume of the system without altering the tuning characteristics of the receiving set.

To the accomplishment of the foregoing and such other objects as will hereinafter appear, my invention consists in the elements and their relation one to the other, as hereinafter more particularly described and sought to be defined in the claims; reference being had to the accompanying drawings which show the preferred embodiments of my invention, and in which:

Fig. 1 is a wiring diagrammatic view of a radio receiving system embodying my invention, and showing one form of cascading and neutralizing control, Fig. 2 is a wiring diagrammatic view of a modification, showing another method of cascading the circuits, and Fig. 3 is a fragmentary wiring view of a modified form of control utilizable with either of the systems shown in Fig. 1 or 2.

Referring now more in detail to the drawings and first to Fig. 1 thereof, I show the invention applied to a radio frequency system having five radio frequency tubes or electron discharge devices, designated sequentially as 1 R. F., 2 R. F., 3 R. F., 4 R. F., and 5 R. F., arranged in cascade and followed by an electron discharge device or tube employed as a detector and designated as Det., the system being capable of use with a loop antenna generally designated as Ant. Each of the electron discharge devices or tubes is of the three-electrode type having a filament, grid and plate, denoted respectively by $f$, $g$ and $p$, with an exponent corresponding to the position of the tube in the series. The filaments are controlled by filament circuits all connected to the battery A, said filament circuits being denoted in Fig. 1 by F with an exponent corresponding to the position of the tubes, each of the filament circuits preferably including the resistance or rheostat $r'$ to $r^6$ for regulating the intensity of incandescence of the filament, the rheostats $r^3$, $r^4$ and $r^5$ being preferably adjustable and the remaining rheostats being preferably fixed, for reasons that will appear clearer hereinafter.

The cascaded electron discharge devices each include input and output circuits designated as $i$ and $o$ respectively with an exponent corresponding to the position of the tube in the series, the first input circuit $i'$ being connected to the loop antenna Ant. and the last output circuit $o^6$ including an audio frequency responsive device such as the telephones Tel., the remaining input and output circuits being interlinked or coupled together preferably by inductive means, the circuits being either transformer or impedance-coupled. As shown in Fig. 1 of the drawings, the output circuit $o'$ is coupled to the input circuit $i^2$ by means of the transformer T′ having the primary P′ and the secondary S′, and the output circuit $o^2$ is coupled to the input circuit $i^3$ by means of the transformer $T^2$ having the primary $P^2$ and the secondary $S^2$, while the remaining circuits are impedance-coupled, the circuits $o^3$ and $i^4$ being coupled by the impedance I′, the circuits $o^4$ and $i^5$ by the impedance $I^2$, and the circuits $o^5$ and $i^6$ by the impedance $I^3$. The output circuits, as usual, include the battery B, which battery is connected as shown to the A battery.

As heretofore mentioned, the radio frequency amplifying system of my present invention embodies the cascading of one or more untuned radio frequency stages onto a tuned radio frequency stage, with the reactions between the same controlled so as to eliminate the de-stabilizing transition which takes place during the tuning of the system and which has the effect of changing the characteristics of the tuned stage from that of being too overdamped to that of producing excessive oscillations, resulting either in such a large loss of energy as to render the system wholly inefficient, or the production of a powerful disturbing reaction which cannot be neutralized because of the transition of the characteristics of the tuned circuit during the tuning process. I have discovered that these disturbing changes in the characteristic of the tuned circuit during the tuning of the same are due to the natural frequency constants of the untuned output circuit and its relation to the frequency range or wave length band through which the tuned stage is adjustable, and that by predetermining the natural frequency constants of the output circuit, the control of the reactions between the untuned and tuned stages may be obtained. More specifically, I have found that the variation or transition from overdamping to excessive oscillations of the tuned input circuit of the transition tube occurs over a narrow range of wave length about the natural frequency of the untuned transformer system, and that at reception frequencies higher than the natural frequency of the untuned output stage, the reaction is to produce a positive resistance in the tuned input stage over a wide range of the higher frequencies, and that at frequencies lower than the natural frequency of the untuned transformer system or stage, the reaction is to produce a negative resistance in the input circuit over a large range of frequency variation. In short, the natural frequency of the output stage is the transition or critical point, and the change or variation of frequency of the input or tuned stage from a frequency above to a frequency below such natural frequency produces the disturbing change of reaction.

To remedy the defect, I propose the predetermining of the natural frequency of the output stage or circuit with relation to the range of frequencies for which the system is to be designed in a manner so as to prevent the production of any damping reaction, and so as to produce only an oscillation-creating feed-back reaction throughout the whole wave length or frequency range for which the system is built. By this means I am enabled not only to eliminate the transition or critical point, but to fix or stabilize the oscillations so that means may be employed for effectively neutralizing or balancing the same. To accomplish the desired results, I select the characteristics of the transformer or impedance coupling means for the untuned stage such that the natural frequency of the untuned output circuit is greater than the highest frequency of the predetermined frequency range through which the tuned stage is tunable. By thus selecting the natural frequency or wave length of the untuned stage, the system will oscillate during all changes in tuning of the tuned input circuit in the absence of any feed-back neutralizing means. With the system possessing this characteristic, a definite control may then be introduced to neutralize the feed-back-creating oscillations through the whole range of frequencies which the system is capable of transmitting.

Referring now more in detail to Fig. 1 of the drawings, I show the untuned stage cascaded to the tuned stage embodied in the second radio frequency tube 2 R. F., the input circuit $i^2$ of which is tunable through a predetermined wave length range by means of an adjustable condenser C, the output circuit $o^2$ of this tube and the coupled input circuit $i^3$ of the third radio frequency tube 3 R. F. being non-tunable, these circuits being coupled by the transformer $T^2$ having a natural frequency in circuit greater than the highest frequency through which the input circuit $i^2$ is tunable. Viewed from another aspect, the natural wave length of the output transformer $T^2$ in connected circuit or the natural wave length of the coupled circuits $o^2$—$i^3$ is smaller than the lowest wave length that can be transmitted through the system by adjustment of the input tuning condenser C. Viewed from still another aspect the arrangement is such that the load in the plate or output circuit $o^2$ combined with the load reflected thereinto by the subsequently coupled circuit $i^3$ is an impedance having a natural wave length lower than the lowest wave length of the system, or conversely, having a natural frequency greater than the highest frequency to which the input circuit $i^2$ is tunable. The transition tube is selected as the second radio frequency tube, so that an additional tuning control may be had, the same consisting in the adjustable condenser C′ arranged in parallel with the loop antenna for tuning the first input circuit $i'$ to the selected frequency. With this arrangement, the condensers C and C′ comprise the two tuning units for selecting the frequency desired.

To obtain the most efficient results, the primary and secondary windings of the transformer $T^2$ of the untuned stage should be as tightly coupled as possible; and with a wave length range of 200–600 meters, it is of importance to keep down the distributed capacity of the windings to a minimum, so that a maximum reactance consistent with the frequency condition may be secured. Since on short waves it is most difficult, if not impossible, to make an untuned transformer with a real step-up of voltage over the wave length range, and since practically all transformers of this type step down the voltage, the impedance type of coupling is preferable. The use of impedance and transformer couplings in the system is determined by practical considerations.

I have found empirically that when the natural frequency of the untuned stage is thus selected and made greater than the highest frequency of the frequency range for which the system is tunable, that the reaction between the output circuit of the transition tube, such as the second radio frequency tube of Fig. 1, to the tuned input circuit thereof is substantially constant over the whole wave length range. The constancy of the reaction may be explained as being associated with the tendency of the input circuit to drop in resistance when the frequency is decreased. The positive resistance, therefore, decreases, and the negative resistance of reaction also decreases due to the drop in reacting voltage on the plate, which in turn follows from the decrease of inductive reactance of the plate circuit. At the lower frequencies the net result therefore is probably to hold the input circuit at a substantially constant negative resistance.

It will be readily seen, therefore, that due first to the stabilization of the reaction between the untuned and the tuned stage, and second to the substantial constancy of this reaction over the whole wave length range, the reactions are capable of definite control and neutralization. My present invention therefore comprehends as a second step the provision of means associated with the untuned stage for neutralizing or balancing these reactions. For neutralizing the stabilized reactions, I may employ any of a variety of types of neutralizing systems such as the magnetic and capacitive forms known to the art, but I prefer, by reason of the advantages hereinafter referred to, to employ the resistance or feed-forward type of neutralization described and claimed by me in my copending application Ser. No. 742,342, filed Oct. 8, 1924, for Method of and means for controlling energy feed-back in electron discharge devices, and application Ser. No. 42,399, filed July 9, 1925, for Electron discharge tube amplifier systems.

The resistance or feed-forward type of neutralizing means comprises, as shown in Fig. 1 of the drawings, a resistance R associated with the primary $P^2$ of the untuned output transformer $T^2$, which resistance has a value of the order of magnitude of the ratio between the output impedance of the tube and the amplification constant thereof; and such resistance is preferably about 1500 ohms, and desirably is made variable in a range of from 950 to 1500 ohms so as to hold the input circuit $i^2$ of the tube 2 R. F. with a slight positive resistance. For the purpose of telephony, the neutralizing resistance R is adjusted to give the input circuit $i^2$ a damping factor of logarithmic decrement .01 or .02, this factor of damping depending upon the number of cascaded tuned circuits, the logarithmic decrement increasing with the number of such tuned circuits. As explained in my aforementioned copending application Ser. No. 742,342, the insertion of the resistance R in the plate or ouput circuit $o^2$ has the effect of absorbing or abstracting energy from the grid circuit in proportion to and corresponding with the energy retransfer or feed-back that takes place from the output or plate circuit to the grid circuit of the tube. The resistance R, as described in the aforesaid copending application, is preferably inductance-free so that all of the available inductance may be conserved for the energy transfer from one tube to a succeeding tube, and should be capacity-free so that the resistance R may be kept as small as possible to minimize the decrease of plate voltage due to the voltage drop in the plate circuit and so that a balance for all frequencies may be had.

The use of this resistance or feed-forward form of neutralization is preferred for the following reasons:

1. No additional inductance or capacity is added to the untuned transformer circuit, so that one may design the transformer with a sufficiently high reactance to be effective for developing the plate circuit energy in spite of the limitation imposed that the natural frequency should be greater than the highest frequency of transmission.

2. The absence of tuning in this stage means a substantially constant feed-back reaction at all wave lengths. The feed-forward resistance may therefore be left substantially constant. This is an additional factor of stability to those enumerated in my prior applications, in which it was shown that the feed-forward resistance was independent of tube amplification and tube capacity.

3. The slight voltage drop due to the feed-forward resistance may be recovered and used effectively, as in the output circuit for the third and fifth radio frequency tubes which are impedance-coupled, as will be hereinafter described, and have the feed-forward resistance included as part of the plate circuit load, as will be pointed out below. Even though the voltages across resistance and inductance add vectorially, there still remain substantial net gains in relation to the amplification obtainable per tube with this type of amplifier. In the other types of known neutralization methods, such incidental losses could not be recovered.

4. It is probable that the phase of the amplified output voltages is held to that causing minimum reaction on the tuned input circuits. It is only by some such explanation that I can account for the extremely high stability of the whole system with amplifications from ten to twenty times higher than have been previously obtainable.

The output circuits of any of the radio frequency tubes 2—5 may be, as stated, either transformer or impedance-coupled, and as already described, the output circuits $o^3$, $o^4$, and $o^5$ of Fig. 1 are shown embodying impedance coupling means. Each of these stages may be provided with feed-forward resistance means, and to this end the output circuits $o^3$ and $o^5$ are shown provided with the feed-forward resistances R′ and $R^2$ respectively, which resistance may be of the order of 3,000 to 5,000 ohms. It is not essential that these feed-forward resistances be included in each of the stages, and hence the same is merely shown embodied in the output circuits $o^3$ and $o^5$. Only a very considerable feed-back reaction through the untuned radio frequency tubes will create oscillation, so that the range of permissible feed-back reaction is large. The larger feed-forward resistances of 3,000 to 5,000 ohms associated with the radio frequency tubes 3 and 5 are believed to be due to the larger inductances which are used or may be used in these stages. As already stated, when the circuits are impedance-coupled, the feed-forward resistance, such as R′, and the coupling inductance, such as I′, together form the output loads, since a slightly higher efficiency can be obtained by this means on the longer waves because the inductive reactance of the plate circuit inductance drops to relatively low values on the longer waves, so that the voltage drop on the feed-forward resistance becomes relatively appreciable. These two voltages are at right angles, so that their sum is only the vector sum, yet in the practical case where the inductive reactance of the impedance I′ at the long wave may drop to say 3,000 ohms, and where a feed-forward resistance of 1,500 ohms is used, the vector sum becomes 3,300 ohms, resulting in a gain of 10% in efficiency of the amplifier. Preferably also the first input circuit $o'$ is provided with a small, such as a 1,000 ohm, feed-forward resistance $R^3$.

For controlling the output volume of the system, the resistances $r^3$, $r^4$ and $r^5$ are made adjustable as previously described, while the resistances or rheostats $r'$ and $r^2$ are maintained constant, this method of controlling the volume being desirable for securing a volume control without affecting the stability or the tuning characteristics of the system. Thus it will be seen that a variation of the filament current of the second radio frequency tube 2 R. F. would result in slight detuning of its input circuit due to the capacitive change from the feed-forward reaction. Also a variation of the filament current of the first radio frequency tube 1 R. F. would result in changes in the selectivity of the system due to, firstly, a change in the reaction through the first tube, and secondly, to a change in the resistance of the input circuit of the second tube due to the change in tube resistance across the primary of the tuned transformer T′. The radio frequency tubes 3—5 however, by their filament current variation produce no change in tuning or in selectivity, but do produce a large variation in the volume of the system.

As an alternative form of volume control, I may employ the type of resistance neutralizing means shown in Fig. 3 of the drawings and described and claimed in my copending application 42,399 aforementioned, this comprising the provision of means for controlling the energy output amplification or volume of the system simultaneously with the control of the stabilization thereof. More specifically, and referring to Fig. 3 of the drawings, the volume and stabilization control means comprises the coupling of an output circuit $o$ of one tube to an input circuit $i$ of a succeeding tube by means of a transformer such as T having a primary P and a secondary S and, associating with the transformer primary P, a potentiometer generally designated at Pot. which preferably comprises a resistance element arranged across and preferably in shunt with the transformer primary P and a movable contact element $x$ connected to the plate of the first tube and movable along the potentiometer resistance, movement of the contact along the potentiometer resistance having the effect of controlling the feed-back and feed-forward reactions and the selectivity of the amplifier as a whole, and of controlling the energy transmitted from the output circuit $o$ to the suceeding circuits.

The input circuits $i^4$, $i^5$ and $i^6$ of the fourth and fifth radio frequency tubes and the detecting tube are each desirably provided with a leak resistance designated respectively as $l'$, $l^2$ and $l^3$, each being of the order of a megohm. Also desirably a condenser $c^2$ of the order of one-half a microfarad is placed in shunt with the battery B, and a condenser $c^3$ of the order of .005 microfarads is placed in the last output circuit $o^6$ in shunt with the B battery and plate $p^6$. Preferably also coupling condensers $c^4$, $c^5$ and $c^6$ are provided in the input circuits $i^4$, $i^5$ and $i^6$.

Referring now to Fig. 2 of the drawings, I show a modification of the system, in which instead of cascading a plurality of untuned stages to a tuned stage, as shown in Fig. 1, the tuned and untuned stages are arranged in alternating relation. This system shown in Fig. 2 also comprises a plurality, such as six tubes, arranged in cascade or series and including five radio frequency tubes and a detecting tube designated frequently 1 R. F., 2 R. F., 3 R. F., 4 R. F., 5 R. F. and Det., each tube including the three electrodes, the filament, the grid and the plate designated with reference characters corresponding to those of Fig. 1 of the drawings. The other corresponding parts, such as the A and B batteries, the filament circuits, the filament rheostats, the input and the output circuits, are similarly provided with corresponding reference characters.

To alternate the tuned and untuned stages, the first input circuit $i$ of Fig. 2 is made tunable by means of the variable condenser $c^1$ and the next stage comprising the output circuit $o'$-input circuit $i^2$ is made non-tunable, these circuits being coupled by the transformer $T^3$, the third stage comprising the output circuit $o^2$ and the input circuit $i^3$ being in turn made tunable by means of the condenser $c^3$ connected in shunt with the secondary of the coupling transformer $T^4$, the fourth stage being in turn non-tunable and comprising the output circuit $o^3$ and the input circuit $i^4$ coupled by means of the impedance $I^4$, while the fifth and sixth stages are made tunable and non-tunable respectively, the fifth stage comprising the coupled circuits $o^4$ and $i^5$ coupled by means of the transformer $T^5$ across the secondary of which is the tuning condenser $C^9$, the circuits $o^5$ and $i^6$ being in turn coupled by means of the impedance $I^5$. The transformer and impedance coupling devices may be varied as desired, the same being shown to exemplify both methods of applying the inductive coupling between the circuits.

In the form of the invention shown in Fig. 2, each of the untuned output circuits is constructed to have a natural wave length lower than the lowest wave length for which the other circuits are tunable, embodying the first principle of the present invention, and each of these untuned circuits is provided preferably with the feed-forward type of resistance neutralizing means, the same being shown as the variable resistance $R^4$ for the untuned output circuit $o'$, $R^5$ for the untuned output circuit $o^3$, and the variable resistance $R^6$ for the untuned output circuit $o^5$. Desirably also some of the tuned circuits may be provided with feed-back neutralizing means such as the resistance $R^7$ associated with the primary of the transformer $T^4$. The system shown in Fig. 2 may be used with a loop or other type of antenna designated as Ant., to which the system may be coupled by means of the transformer $T^6$.

The principle of operation of my improved radio frequency system and the many advantages thereof will in the main be fully apparent from the above detailed description thereof. In either of the modifications illustrated, an untuned stage, such as the output stage of the second radio frequency transformer 2 R. F., (Fig. 1) is cascaded onto a tuned stage such as the tuned input circuit $i^2$ of the radio frequency tube, the output circuit having a natural frequency greater than the highest frequency for which the tuned input circuit is adjustable. By the provision of this means, the reactions between the untuned stage and the tuned stage are stabilized and rendered constant so that the same may be controlled and neutralized by means of a neutralizing device, such as the feed-forward resistance R of Fig. 1. When thus neutralized, the reactions at the input terminals of the untuned stage or untuned system are neutralized and the untuned amplifier circuit network acts or behaves as a pure and constant capacitance. When the tuned stage or selector circuit system is thus associated with an amplifier which is caused to act or behave as a pure capacitance, the reactions of the amplifier network upon the selector system which tend to disturb or destroy the selectivity thereof are effectively neutralized or eliminated. By stabilizing and neutralizing the reactions, a large number of radio frequency stages may be arranged in cascade or series, producing a high power amplifying system which yields from ten to twenty times the amplification of radio frequency systems hitherto devised. The cascaded circuits are, moreover, so interrelated as to produce a highly stable radio receiving set, with a high degree of selectivity obtainable with the employment of two control elements C and C′, the system being designed so as to permit facile control of the output volume by simultaneous or other adjustment of the filament rheostats $r^3$—$r^5$ without altering the tuning or affecting the stability of the system as a whole.

For a further understanding of the advantages of the system embodying my present invention, the same may be compared with the tuned radio frequency systems of known types and the limitations thereof. As heretofore pointed out, due to the feed-back reactions incident to tuned systems, it is impossible to obtain any further amplification by utilizing a third radio frequency tube, whereas with the employment of the principles of my invention I am enabled to produce a very stable and high-powered set with as many as five radio frequency tubes in cascade.

The reasons underlying the larger possibilities of a system embodying the present invention are manifold. Where additional amplification was sought by tuned amplification, there occurred in the output circuit relatively high oscillatory currents, because the last R. F. output circuit secured its voltage gain through resonance. The amount of kinetic energy stored in this last tuned circuit is therefore much greater than would be stored in an untuned output circuit having equal amplification. Another factor is concerned with the phase of the reaction. Obviously, to generate oscillations in the initial input circuit, the reacting voltages must serve to assist the currents flowing. Now when the latter input circuits are tuned, the phases of their currents are sharply varied as the circuits are adjusted in the region of resonance. This follows because these circuits usually have low resistance, so that a slight preponderance of capacitive or inductive reaction shifts the phase abruptly through 180°. Therefore in tuning the cascade tuned system, one is bound to strike an adjustment in the very near resonance region at which the reaction produces oscillation. This appears clearly from the manipulation of a three-step cascade tuned amplifier receiver, because it has been found that when very accurate, slow-moving verniers are used on the tuned circuits, it is possible with much care and adjustment to find a setting at which large amplification without oscillation may be secured. Such an adjustment, however, is not practical, as a slight variation in battery voltage, for example, is sufficient to destroy the balance.

In the system of the present invention, however, the lack of resonance currents in the untuned amplifier transformers produces minimum kinetic energy for retransfer, and the phase of the reacting forces is left constant, and probably this combination tends to produce a minimum oscillation-producing force. Moreover, where the last two stages are untuned, the successive grids have exactly opposite voltages differing only in magnitude by a factor of approximately 3 to 1. The lower voltage being near the input, the resulting reaction is therefore less than two-thirds that due to the last grid alone. The amplification that may be secured on the short wave band with the untuned transformer is usually less than the amplification constant of the tube, and is less than that obtainable with a tuned stage, but owing to the fact that the increase in voltage with cascade untuned transformer circuits is geometric, it will be seen that two untuned stages will perform the work of one tuned stage, and due to the capability of cascading a large number of untuned stages with the employment of the principles of my invention, it will be readily seen that in the system of my invention from six to twenty times as much amplification as was obtainable in the prior types of tuned radio frequency systems may be had with the use of similar engineering precautions.

While I have shown my invention in the preferred forms, it will be apparent that many changes and modifications may be made in the structure disclosed, without departing from the spirit of the invention, defined in the following claims.

I claim:

1. An amplifying system comprising an electron discharge device having an input circuit and an output circuit capacitively coupled by means of said device to the input circuit, means for tuning the input circuit through a predetermined range of frequencies, the output circuit being untuned and embodying non-tunable coupling means, coupling the same to a subsequent circuit, said untuned output circuit in the combination with the subsequently coupled circuit having a natural frequency greater than the highest frequency of the whole frequency range through which the input circuit is tunable whereby the reactions of the output circuit on the input circuit due to the said capacitive coupling are fixed for the whole frequency range.

2. A radio frequency amplifying system comprising an electron discharge device having an input circuit and an output circuit capacitively coupled by means of said device to the input circuit, means for tuning the input circuit through a predetermined range of radio frequencies, the output circuit being untuned and embodying non-tunable inductive coupling means, coupling the same to a subsequent circuit, the load of said output circuit together with the load reflected thereinto by the said subsequently coupled circuit comprising an impedance having a natural frequency greater than the highest frequency of the whole frequency range through which the input circuit is tunable whereby the reactions of the output circuit on the input circuit due to the said capacitive coupling are fixed for the whole frequency range.

3. An amplifying system comprising an electron discharge device having an input circuit and an output circuit, means for tuning the input circuit through a predetermined range of frequencies, the output circuit being untuned and embodying means for coupling the same to a subsequent circuit, the load of said untuned output circuit combined with the load reflected thereinto by the subsequently coupled circuit comprising an impedance having a natural frequency greater than the highest frequency of the whole frequency range through which the input circuit is tunable whereby feed-back reactions from the output circuit to the input circuit are produced for the whole frequency range, and means for controlling the feed-back reactions.

4. An amplifying system comprising an electron discharge device having an input circuit and an output circuit, means for tuning the input circuit through a predetermined range of frequencies, the output circuit being untuned and embodying means for coupling the same to a subsequent circuit, the load of said untuned output circuit combined with the load reflected thereinto by the subsequently coupled circuit comprising an impedance having a natural frequency greater than the highest frequency of the whole frequency range through which the input circuit is tunable whereby energy feed-back from the output circuit to the input circuit is produced for the whole frequency range, and means for producing an energy feed-forward from the input to the output circuit to neutralize said feed-back of energy.

5. An amplifying system comprising an electron discharge device having an input circuit and an output circuit, means for tuning the input circuit through a predetermined range of frequencies, the output circuit being untuned and embodying non-tunable inductive coupling means for coupling the same to a subsequent circuit, the load of said untuned output circuit combined with the load reflected thereinto by the subsequently coupled circuit comprising an inductive impedance having a natural frequency greater than the highest frequency of the whole range of frequencies through which the input circuit is tunable whereby energy feed-back from the output circuit to the input circuit is produced for the whole frequency range, and means for neutralizing such feed-back of energy.

6. An amplifying system comprising an electron discharge device having an input circuit and an output circuit, means for tuning the input circuit through a predetermined range of frequencies, the output circuit being untuned and embodying means for coupling the same to a subsequent circuit, the load of said untuned output circuit combined with the load reflected thereinto by the subsequently coupled circuit comprising an impedance having a natural frequency greater than the highest frequency of said predetermined range of frequencies whereby energy feed-back from the output circuit to the input circuit is produced for the whole frequency range, and resistance means located in the output circuit having a value of the order of magnitude of the ratio of the output impedance of the device and the amplification constant thereof for producing an energy feed-forward from the input to the output circuit to neutralize said feed-back of energy.

7. An amplifying system comprising an electron discharge device having an input circuit and an output circuit, means for tuning the input circuit through a predetermined range of frequencies, the output circuit being untuned and embodying means for coupling the output circuit to a subsequent circuit, the load of said untuned output circuit combined with the load reflected thereinto by the subsequently coupled circuit comprising an impedance having a natural frequency greater than the highest frequency of said predetermined range of frequencies whereby energy feed-back from the output circuit to the input circuit is produced for the whole frequency range, and a resistance in said output circuit for producing an energy feed-forward from the input to the output circuit to neutralize said feed-back of energy.

8. An amplifying system comprising an electron discharge device having an input circuit and an output circuit, means for tuning the input circuit through a predetermined range of frequencies, the output circuit being untuned and embodying a plate circuit and means for coupling the plate circuit to a subsequent circuit, the load of said untuned output circuit combined with the load reflected thereinto by the subsequently coupled circuit comprising an impedance having a natural frequency greater than the highest frequency of said predetermined range of frequencies whereby energy feed-back from the output circuit to the input circuit is produced for the whole frequency range, and a capacity and inductance free resistance in the plate circuit for producing an energy feed-forward from the input to the output circuit to neutralize said feed-back of energy.

9. A cascade amplifying system comprising a pair of electron discharge tubes, each having input and output circuits capacitively coupled by the tube structure, the output circuit of the first tube being coupled by non-tunable means to the input circuit of the second tube, means for tuning the input circuit of the first tube through a predetermined wave length band, the said non-tunable coupled circuits having a natural wave length smaller than the lowest wave length of said wave length band whereby the reactions of said non-tunable coupled circuits on the tunable input circuit due to the capacitive coupling therebetween are fixed over the whole wave length band of the tunable input circuit.

10. A cascade amplifying system comprising a pair of electron discharge tubes, each having input and output circuits capacitively coupled by the tube structure, the output circuit of the first tube being coupled by non-tunable inductive means to the input circuit of the second tube, means for tuning the input circuit of the first tube through a predetermined wave length band, the said non-tunable coupled circuits having a natural wave length smaller than the lowest wave length of said wave length band whereby the reactions of said non-tunable coupled circuits on the tunable input circuit due to the capacitive coupling therebetween are fixed over the whole wave length band of the tunable input circuit.

11. A cascade amplifying system comprising a pair of electron discharge tubes, each having input and output circuits, the output circuit, of the first tube being coupled by non-tunable means to the input circuit of the second tube, means for tuning the input circuit of the first tube through a predetermined wave length band, the said non-tunable coupled circuits in coupled combination having a natural wave length smaller than the lowest wave length of said wave length band, whereby energy feed-back from the output to the input circuit of the first tube is produced for the whole wave length band through which the input circuit is tunable, and means for neutralizing such feed-back of energy.

12. A cascade amplifying system comprising a pair of electron discharge tubes, each having input and output circuits, the output circuit of the first tube being coupled by non-tunable means to the input circuit of the second tube, means for tuning the input circuit of the first tube through a predetermined wave length band, the said non-tunable coupled circuits in coupled combination having a natural wave length smaller than the lowest wave length of said wave length band whereby energy feed-back from the output to the input circuit of the first tube is produced for the whole wave length band through which the input circuit is tunable, and a resistance in the plate circuit of the first tube having a value of the order of magnitude of the output impedance of the tube divided by the amplification constant thereof for producing an energy feed-forward in the first tube to neutralize the feed-back of energy therein.

13. A cascade amplifying system comprising a pair of electron discharge tubes, each having input and output circuits, the output circuit of the first tube being coupled by non-tunable means to the input circuit of the second tube, means for tuning the input circuit of the first tube through a predetermined wave length band, the said non-tunable coupled circuits in coupled combination having a natural wave length smaller than the lowest wave length of said wave length band whereby energy feed-back from the output to the input circuit of the first tube is produced for the whole wave length band through which the said input circuit of the first tube is tunable and means for producing a feed-forward of energy from the input to the outupt circuit of the first tube to control said feed-back of energy.

14. An amplifying system comprising an electron discharge tube having an input circuit and an output circuit capacitively coupled by means of the tube structure to the input circuit, means for tuning the input circuit through a predetermined range of frequencies, the output circuit being untuned and embodying an untuned stage having non-tunable coupling means for inductively coupling the same to a subsequent circuit, means for producing regenerative feed-back reactions of said untuned output circuit on the tuned input circuit due to the capacitive coupling therebetween for the whole predetermined frequency range, and means for neutralizing such regenerative feed-back reactions.

15. A radio frequency amplifying system comprising an electron discharge device having an input circuit and an output circuit capacitively coupled by the device to the input circuit, means for tuning the input circuit through a predetermined range of radio frequencies, the output circuit being untuned and embodying transformer means non-tunably coupled to a subsequent circuit, means for producing an energy regenerative feed-back reaction from the untuned output circuit to the input circuit for the whole frequency range and means for neutralizing said feed-back reaction.

16. A radio frequency amplifying system comprising an electron discharge device having an input circuit and an output circuit capacitively coupled by the device to the input circuit, means for tuning the input circuit through a predetermined range of radio frequencies, the output circuit being untuned and embodying a transformer non-tunably coupled to a subsequent circuit, means for producing an energy regenerative feed-back reaction from the untuned output circuit to the input circuit for the whole frequency range and resistance means associated with the primary of the transformer for neutralizing said feed-back reaction.

17. A cascade radio frequency amplifying system comprising a pair of electron discharge tubes, each having an input circuit and an output circuit capacitively coupled by means of the tube structure to the input circuit, means for tuning the input circuit of the first tube through a predetermined range of frequencies, the output circuit of the first tube and the input circuit of the second tube being coupled by non-tunable means to produce an untuned stage, means for producing regenerative feed-back reactions of said non-tunable coupled circuits on the tuned input circuit due to the capacitive coupling therebetween for the whole predetermined frequency range, and means for neutralizing the said regenerative feed-back reactions.

18. A cascade radio frequency amplifying system comprising a pair of electron discharge tubes, each having input and output circuits, the output circuit of the first tube being coupled by non-tunable transformer means to the input circuit of the second tube, means for tuning the input circuit of the first tube through a predetermined range of radio frequencies and resistance means associated with said transformer means and having a value of the order of magnitude of the ratio of the output impedance of the tube and the amplification constant thereof for producing a feed-forward reaction in the first tube for neutralizing for the feed-back of energy taking place from the said untuned output circuit to the tuned input circuit.

19. A radio frequency amplifying system comprising at least three electron discharge tubes in cascade, each having an input circuit and an output circuit, means for tuning the input circuit of the first tube through a predetermined range of frequencies, transformer means coupling the output circuit of the first tube to the input circuit of the second tube and the output circuit of the second tube to the input circuit of the third tube, all said circuits save the input circuit of the first tube being untuned, and the untuned output circuit of the first tube having a natural frequency greater than the highest frequency of said predetermined range of frequencies through which the first input circuit is tunable whereby the reactions between the circuits of the first tube are fixed for the whole range of frequencies.

20. A radio frequency amplifying system comprising a pair of electron discharge devices in cascade, each having an input circuit and an output circuit, the output circuit of the first tube being inductively coupled to the input circuit of the second tube, means for tuning the input circuits of both tubes through a predetermined range of frequencies, the output circuit of the second tube being untuned and embodying non-tunable coupling means for coupling the same to a subsequent circuit, said non-tunable coupling means in connected circuit having a natural frequency greater than the highest frequency of said predetermined range of frequencies whereby the reactions between the untuned output circuit and the input circuit thereof are fixed for the whole range of frequencies.

21. A radio frequency amplifying system comprising a pair of electron discharge devices in cascade, each having an input circuit and an output circuit, the output circuit of the first tube being inductively coupled to the input circuit of the second tube, means for tuning the input circuits of both tubes through a predetermined range of frequencies, the output circuit of the second tube being untuned and embodying non-tunable coupling means for coupling the same to a subsequent circuit, said non-tunable coupling means in connected circuit having a natural frequency greater than the highest frequency of said predetermined range of frequencies, and means for neutralizing the feed-back reactions between the output and input circuits of the second tube.

22. An apparatus for selecting and amplifying high frequency oscillations, comprising a selector circuit operative for receiving high frequency oscillating energy and for selecting energy of a desired frequency from such received energy, an untuned electron discharge tube amplifier circuit network receiving such selected energy and operative for amplifying the same, said amplifier circuit network having a uni-directional selectivity disturbing reaction on the selector circuit, and means for neutralizing said selectivity disturbing reaction.

23. An apparatus for selecting and amplifying high frequency oscillations, comprising a selector circuit network operative for receiving high frequency oscillating energy and for selecting energy of a desired frequency from such received energy, an amplifier circuit network receiving such selected energy and operative for amplifying the same, said amplifier network consisting of a plurality of electron discharge tubes coupled together by non-tunable coupling means, and having a selectivity disturbing reaction on the selector circuit network, and means effective at the input terminals of said tube amplifier circuit network for neutralizing said selectivity disturbing reaction over the working frequency range.

24. An apparatus for selecting and amplifying high frequency oscillations comprising a selector circuit network embodying a plurality of tuned circuits arranged in cascade and operative for receiving high frequency oscillating energy and for geometrically selecting energy of a desired frequency therefrom, an amplifier circuit network embodying a plurality of untuned stages of electron discharge tubes also arranged in cascade for receiving such geometrically selected energy and operative for amplifying the same, the output terminals of said selector circuit network feeding into the input terminals of said amplifier circuit network, said amplifier circuit network having a selectivity disturbing reaction on said selector circuit network, and fixed means for neutralizing the said selectivity disturbing reaction over the working frequency range.

25. An apparatus for selecting and amplifying high frequency oscillations comprising an electron discharge tube untuned amplifier, a tunable selector circuit connected to and feeding into the input terminals of said untuned amplifier, and means for causing the untuned amplifier to act as a pure reactance at the said input terminals thereof over a given range of frequencies whereby the selectivity disturbing reactions of said untuned amplifier on said selector circuit are eliminated.

26. An apparatus for selecting and amplifying high frequency oscillations comprising an electron discharge tube untuned amplifier, a tunable selector circuit connected to and feeding into the input terminals of said untuned amplifier, and means for causing the untuned amplifier to act as a pure and constant capacitance at the said input terminals thereof over a given range of frequencies whereby the selectivity disturbing reactions of said untuned amplifier on said selector circuit are eliminated.

27. An apparatus for selecting and amplifying high frequency oscillations comprising an untuned electron discharge tube amplifier network, a selector circuit tunable over a given frequency range connected to and feeding into the input terminals of a tube of said untuned amplifier network, and means for causing the untuned amplifier network to act as a pure capacitance at the said input terminals thereof over said given range of frequencies whereby the selectivity disturbing reactions of said untuned amplifier network on said selector circuit are eliminated.

28. An apparatus for selecting and amplifying high frequency oscillations comprising an untuned amplifier network, said network consisting of a plurality of electron discharge tubes coupled together seriatim by non-tunable coupling means, a tunable selector circuit connected to and feeding into the input terminals of the first tube of said untuned amplifier network, and means for causing the untuned amplifier network to act as a pure reactance at the said input terminals thereof over a given range of frequencies whereby the selectivity disturbing reactions of said untuned amplifier on said selector circuit are eliminated.

Signed at New York city, in the county of New York and State of New York, this 17 day of September, 1929.

LESTER L. JONES.